United States Patent
Lee et al.

(10) Patent No.: US 8,927,956 B2
(45) Date of Patent: Jan. 6, 2015

(54) RESISTANCE TYPE MEMORY DEVICE

(75) Inventors: Ming-Daou Lee, Hsinchu (TW); Chia-Hua Ho, Hsinchu (TW); Erh-Kun Lai, Hsinchu (TW); Kuang-Yeu Hsieh, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 87 days.

(21) Appl. No.: 12/403,186

(22) Filed: Mar. 12, 2009

(65) Prior Publication Data

US 2009/0166604 A1 Jul. 2, 2009

Related U.S. Application Data

(62) Division of application No. 11/695,780, filed on Apr. 3, 2007, now Pat. No. 7,524,722.

(30) Foreign Application Priority Data

Oct. 12, 2006 (TW) .............................. 95137507 A

(51) Int. Cl.
*H01L 45/00* (2006.01)
*G11C 11/00* (2006.01)
*G11C 13/00* (2006.01)
*G11C 11/54* (2006.01)
*G11C 11/14* (2006.01)
*G11C 11/56* (2006.01)

(52) U.S. Cl.
CPC .............. *G11C 11/54* (2013.01); *G11C 11/14* (2013.01); *G11C 11/5685* (2013.01); *G11C 13/0007* (2013.01); *G11C 13/0069* (2013.01); *H01L 45/04* (2013.01); *H01L 45/1233* (2013.01); *H01L 45/146* (2013.01); *H01L 45/1633* (2013.01); *G11C 2013/009* (2013.01); *G11C 2213/32* (2013.01); *Y10S 438/972* (2013.01)

USPC ................ 257/5; 365/148; 438/972; 257/43; 257/536; 257/537; 257/E45.003

(58) Field of Classification Search
CPC ... H01L 45/04; H01L 45/1233; H01L 45/146; H01L 45/16; H01L 45/1633; G11C 11/5685; G11C 13/0007; G11C 2213/32
USPC .............. 257/528, 529, 536, 537, E21.004, 5, 257/E45.002, 43, E45.003; 438/238, 381, 438/972; 365/148
See application file for complete search history.

(56) References Cited

U.S. PATENT DOCUMENTS 4,931,763 A * 6/1990 Ramesham et al. ...... 338/22 SD
6,204,139 B1 * 3/2001 Liu et al. ...................... 438/385
(Continued)

FOREIGN PATENT DOCUMENTS

TW 534852 6/2003
TW I261356 9/2006

OTHER PUBLICATIONS

Chinese Examination Report of Taiwan Application No. 096126592, dated Jan. 5, 2011.

*Primary Examiner* — Mary Wilczewski
(74) *Attorney, Agent, or Firm* — J.C. Patents

(57) ABSTRACT

A resistance type memory device is provided. The resistance type memory device includes a first and a second conductors and a metal oxide layer. The metal oxide layer is disposed between the first and the second conductors, and the resistance type memory device is defined in a first resistivity. The resistance type memory device is defined in a second resistivity after a first pulse voltage is applied to the metal oxide layer. The resistance type memory device is defined in a third resistivity after a second pulse voltage is applied to the metal oxide layer. The second resistivity is greater than the first resistivity, and the first resistivity is greater than the third resistivity.

9 Claims, 7 Drawing Sheets

(56) References Cited

U.S. PATENT DOCUMENTS

| | | | |
|---|---|---|---|
| 6,346,467 B1 | 2/2002 | Chang et al. | 438/594 |
| 6,798,685 B2* | 9/2004 | Rinerson et al. | 365/100 |
| 6,815,744 B1* | 11/2004 | Beck et al. | 257/295 |
| 6,870,755 B2* | 3/2005 | Rinerson et al. | 365/148 |
| 6,888,745 B2* | 5/2005 | Ehiro et al. | 365/158 |
| 6,906,939 B2* | 6/2005 | Rinerson et al. | 365/63 |
| 6,965,137 B2* | 11/2005 | Kinney et al. | 257/295 |
| 7,038,935 B2* | 5/2006 | Rinerson et al. | 365/148 |
| 7,067,862 B2* | 6/2006 | Rinerson et al. | 257/295 |
| 7,326,979 B2* | 2/2008 | Rinerson et al. | 257/295 |
| 7,524,722 B2* | 4/2009 | Lee et al. | 438/238 |
| 7,629,198 B2* | 12/2009 | Kumar et al. | 438/104 |
| 7,639,523 B2* | 12/2009 | Celinska et al. | 365/148 |
| 7,678,607 B2* | 3/2010 | Chiang et al. | 438/104 |
| 7,704,789 B2* | 4/2010 | Sun et al. | 438/104 |
| 7,800,933 B2* | 9/2010 | Kumar et al. | 365/148 |
| 7,884,349 B2* | 2/2011 | Rinerson et al. | 257/5 |
| 7,960,224 B2* | 6/2011 | Chien et al. | 438/199 |
| 7,960,774 B2* | 6/2011 | Choi et al. | 257/310 |
| 7,977,152 B2* | 7/2011 | Gorer et al. | 438/104 |
| 8,129,704 B2* | 3/2012 | Phatak et al. | 257/2 |
| 8,143,092 B2* | 3/2012 | Kumar et al. | 438/104 |
| 8,144,498 B2* | 3/2012 | Kumar et al. | 365/148 |
| 8,183,553 B2* | 5/2012 | Phatak et al. | 257/4 |
| 2005/0247921 A1* | 11/2005 | Lee et al. | 257/2 |
| 2006/0054950 A1* | 3/2006 | Baek et al. | 257/295 |
| 2007/0045728 A1* | 3/2007 | Lee | 257/340 |
| 2009/0026434 A1* | 1/2009 | Malhotra et al. | 257/2 |

* cited by examiner

RESISTANCE TYPE MEMORY DEVICE

CROSS-REFERENCE TO RELATED APPLICATION

This application is a divisional of and claims the priority benefit of an application Ser. No. 11/695,780, filed on Apr. 3, 2007, now allowed, which claims the priority benefit of Taiwan application serial no. 95137507, filed Oct. 12, 2006. The entirety of each of the above-mentioned patent applications is hereby incorporated by reference herein and made a part of this specification.

BACKGROUND OF THE INVENTION

1. Field of the Invention

The present invention relates to a memory device and a fabricating method and an operating method thereof, and more particularly, to a resistance type memory device and a fabricating method and an operating method thereof.

2. Description of Related Art

Along with the development of the communication technology and the popularity of the Internet, the demands initiated by the public for the communication and processing of the information especially on the audio-video data transmission of great capacity and quick transmission speed are growing. On the other aspect, under the global competition, the work environment is not limited to the office but anywhere in the world at any time, and a great deal of information is needed to support this action and decision. Therefore, the requirements for portable digital apparatuses including the mobile platforms such as a digital notebook computer/NB, a personal digital assistant/PDA, an electronic book/e-book, a mobile phone, and a digital still camera/DSC are increasing significantly. Correspondingly, the requirements for accessing the above digital products through the storage apparatuses are greatly enhanced as well.

Since 1990, the semiconductor storage-based memory is developed, which now becomes a new technology of the storage medium. In order to satisfy the increasing requirements for memories along with the storage or transmission of a great deal of data, developing a new type of the memory device is of great importance and value.

SUMMARY OF THE INVENTION

In view of the foregoing, the present invention is firstly directed to a resistance type memory device, which can be applied to volatile and non-volatile and implement a multiple-bit storage operation at a storage point.

The present invention provides a resistance type memory device which includes a first and a second conductors and a metal oxide layer. The metal oxide layer is disposed between the first and the second conductors, and the resistance type memory device is defined in a first resistivity. The resistance type memory device is defined in a second resistivity after a first pulse voltage is applied to the metal oxide layer. The resistance type memory device is defined in a third resistivity after a second pulse voltage is applied to the metal oxide layer. The second resistivity is greater than the first resistivity, and the first resistivity is greater than the third resistivity.

According to the resistance type memory device disclosed in an embodiment of the present invention, a material of the metal oxide layer comprises tungsten oxide.

According to the resistance type memory device disclosed in an embodiment of the present invention, the resistance type memory device is defined in a fourth resistivity after a third pulse voltage is applied to the metal oxide layer, and the third resistivity is greater than the fourth resistivity.

The present invention further provides a resistance type memory device which includes a bottom electrode, a resistance memory element and a top electrode. The resistance memory element is disposed over the bottom electrode. The top electrode is disposed over the resistance memory element. The resistance type memory device is in a first storage state as a first pulse voltage is applied to the resistance memory element. The resistance type memory device is in a second storage state as the first and a second pulse voltages are applied to the resistance memory element. The resistance type memory device is in a third storage state as the first, the second and a third pulse voltages are applied to the resistance memory element. A polarity of the first pulse voltage is different from a polarity of the second and the third pulse voltages.

According to the resistance type memory device disclosed in an embodiment of the present invention, a material of the resistance memory element comprises tungsten oxide.

According to the resistance type memory device disclosed in an embodiment of the present invention, the resistance type memory device is in a fourth storage state as the first, the second, the third and a fourth pulse voltages are applied to the resistance memory element, and a polarity of the first pulse voltage is different from a polarity of the fourth pulse voltage.

The present invention further provides a resistance type memory device which includes a first and a second electrodes and a variable resistance material layer. The variable resistance material layer is coupled with the first and the second electrodes. A first storage state is defined by applying a first pulse voltage to the variable resistance material layer. A second storage state is defined by applying the first and a second pulse voltages to the variable resistance material layer. A third storage state is defined by applying the first and a third pulse voltages to the variable resistance material layer. The third pulse voltage is greater than the second pulse voltage.

According to the resistance type memory device disclosed in an embodiment of the present invention, a material of the variable resistance material layer comprises tungsten oxide.

According to the resistance type memory device disclosed in an embodiment of the present invention, a fourth storage state is defined by applying the first and a fourth pulse voltages to the variable resistance material layer, and the fourth pulse voltage is greater than the third pulse voltage.

In view of the above, the resistance type memory device provided by the present invention is a multi-level memory cell having the tungsten oxide layer. The resistivity thereof is adjustable through applying the pulse voltage to the tungsten oxide layer. Therefore, the resistance type memory device of the present invention is capable of performing the multiple-bit storage at a storage point. Moreover, the resistance type memory device of the present invention can be applied to both the non-volatile and the volatile memories. In addition, the resistance type memory device has high thermal stability, so that the data storage function of the resistance type memory device is not deteriorated in a high temperature environment.

Furthermore, the method for fabricating the resistance type memory device provided by the present invention adopts a self-aligned manufacturing technology. Thus, no additional masks are required, and the method for fabricating said resistance type memory device can be easily integrated into the current manufacturing process.

On the other hand, the method for operating the resistance type memory provided by the present invention is to apply voltages to the tungsten oxide layers of the resistance type memory devices. Due to different resistivities of the tungsten oxide layers, the resistance type memory devices correspondingly have four different data storage states. Thereby, the requirement of multiple-bit storage at a storage point can be satisfied.

Additionally, in the method for operating the resistance type memory device provided by the present invention, a plurality of the programming operations can be performed repeatedly on the resistance type memory device through applying different pulse voltages, and the programming speed can be significantly increased.

In order to the make the aforementioned and other objects, features and advantages of the present invention comprehensible, a preferred embodiment accompanied with figures are described in detail below.

DESCRIPTION OF EMBODIMENTS

Figure 1:
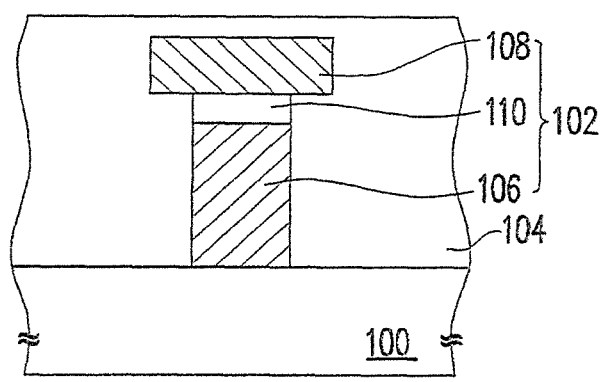
FIG. 1 is a cross-sectional view illustrating a resistance type memory device according to an embodiment of the present invention.

FIG. 1 is a cross-sectional view illustrating a resistance type memory device according to an embodiment of the present invention.

Referring to FIG. 1, the resistance type memory device 102 is disposed on a substrate 100, for example, in a dielectric layer 104 on the substrate 100. The substrate 100 is, for example, a silicon substrate, and the material of the dielectric layer 104 is silicon oxide, for example.

The resistance type memory device 102 includes a tungsten electrode 106, an upper electrode 108, and a tungsten oxide layer 110.

The tungsten electrode 106 is disposed on the substrate 100 and employed as a single electrode. The method for forming the tungsten electrode 106 includes, for example, performing the CVD process.

The upper electrode 108 is disposed on the tungsten electrode 106, and the material of the upper electrode 108 is, for example, semiconductor materials e.g. doped polysilicon, of metal materials e.g. aluminum and copper, and of metal barrier layers e.g. titanium nitride (TiN) and tantalum nitride (TaN). The method for forming the upper electrode 108 includes, for example, performing the CVD process or the physical vapor deposition process.

The tungsten oxide layer 110 is sandwiched between the tungsten electrode 106 and the upper electrode 108, and the resistivity of the tungsten oxide layer 110 can be altered by applying voltages or currents thereto. The method for forming the tungsten oxide layer includes, for example, performing the plasma oxidation process.

The resistance type memory device 102 provided by the aforesaid embodiment includes the tungsten oxide layer 110. Accordingly, the resistivity of the tungsten oxide layer 110 can be adjusted by applying a pulse voltage thereto. Thereby, the resistance type memory device 102 is capable of implementing a multiple-bit storage operation at a storage point. Moreover, the resistance type memory device 102 can be applied to the non-volatile and the volatile memories. In addition, the resistance type memory device 102 has high thermal stability, so that the data storage function thereof is not deteriorated in a high temperature environment (e.g. at 150° C.).

Figure 2A:
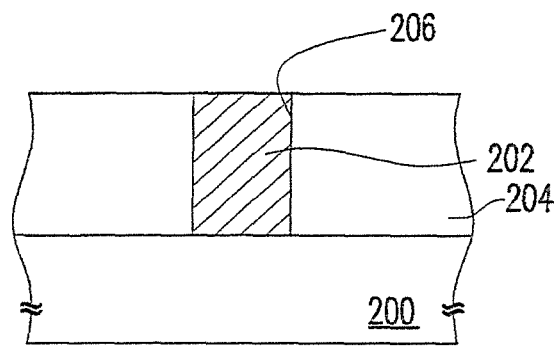
FIGS. 2A to 2C are cross-sectional flow charts illustrating a process of fabricating the resistance type memory device according to an embodiment of the present invention.
Figure 2B:
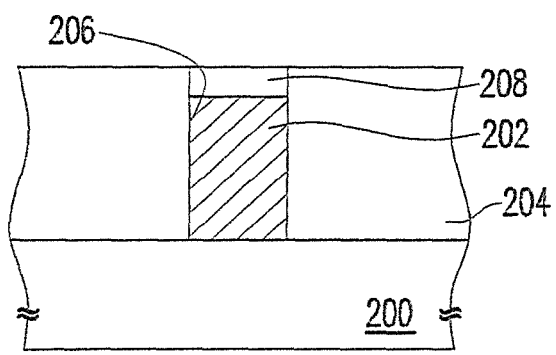
Figure 2C:
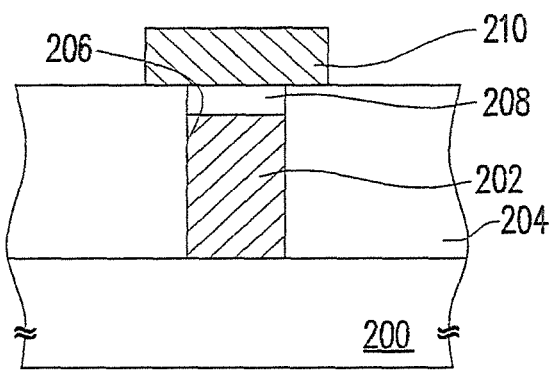

FIGS. 2A to 2C are cross-sectional flow charts illustrating a process of fabricating the resistance type memory device according to an embodiment of the present invention.

As is shown in FIG. 2A, a substrate 200 is provided. The substrate 200 comprises, for example, a silicon substrate.

A tungsten electrode 202 is then formed on the substrate 200. The method for forming the tungsten electrode 202 includes, for example, forming a dielectric layer 204 on the substrate 200, and an opening 206 has been formed in the dielectric layer 204. The material of the dielectric layer 204 is, for example, silicon oxide, and the forming method thereof includes, for example, performing the CVD process. A thickness of the dielectric layer 204 ranges from 100 nm to 1000 nm, for example. Next, a tungsten electrode (not shown) is formed on the dielectric layer 204 and fills the opening 206. The method for forming the tungsten electrode includes, for example, performing the CVD process. Next, the tungsten electrode outside the opening 206 is removed through performing the CMP process.

Referring to FIG. 2B, a tungsten oxide layer 208 is then formed over the tungsten electrode 202. The method for forming the tungsten oxide layer 208 includes, for example, performing the plasma oxidation process. The reactive gas used in the plasma oxidation process is a mixture of oxygen and nitrogen, for example. The plasma required for performing the plasma oxidation process can be formed either inside a reaction chamber or outside the reaction chamber with a later injection thereto.

Next, referring to FIG. 2C, an upper electrode 210 is formed on the tungsten oxide layer 208. The material of the upper electrode 210 is, for example, semiconductor materials e.g. doped polysilicon, metal materials e.g. aluminum and copper, and metal barrier layers e.g. TiN and TaN. The method for forming the upper electrode 210 includes forming an upper electrode layer (not shown) and performing a patterning process on the upper electrode layer. The method for forming the upper electrode layer includes, for example, performing the CVD process or the physical vapor deposition process.

In view of the foregoing, the method for fabricating the resistance type memory device includes oxidizing a part of the tungsten electrode 202 to obtain the tungsten oxide layer 208. Said method adopts a self-aligned manufacturing technology. Thus, no additional masks are required, and the method for fabricating said resistance type memory device can be easily integrated into the current manufacturing process.

The method for operating the resistance type memory will be illustrated in the following paragraphs. The resistance type memory includes a plurality of the resistance type memory devices 102 demonstrated in FIG. 1. Each elements, materials, and forming methods of the resistance type memory devices 102 have already been well described, and detailed descriptions will not be repeated hereinafter.

Referring to FIG. 1, the method for operating the resistance type memory devices 102 includes applying the pulse voltage to the tungsten oxide layer 110 so as to adjust the resistivity thereof.

Here, the resistivity of the tungsten oxide layer 110 refers to a first resistivity when no pulse voltage is applied to the tungsten oxide layer 110, and the resistance type memory device 102 is in a first storage state (0,1).

When the resistivity of the tungsten oxide layer 110 is adjusted to be a second resistivity, the resistance type memory device 102 is programmed to be in a second storage state (0,0).

When the resistivity of the tungsten oxide layer 110 is adjusted to be a third resistivity, the resistance type memory device 102 is programmed to be in a third storage state (1,0).

When the resistivity of the tungsten oxide layer 110 is adjusted to be a fourth resistivity, the resistance type memory device 102 is programmed to be in a fourth storage state (1,1).

Here, the second resistivity is greater than the first resistivity, the first resistivity is greater than the third resistivity, and the third resistivity is greater than the fourth resistivity. The first resistivity ranges from 0.4 ohms-cm to 5.7 ohms-cm, the second resistivity exceeds 5.7 ohms-cm, the third resistivity ranges from 0.07 ohms-cm to 0.4 ohms-cm, and the fourth resistivity is less than 0.07 ohms-cm, for example.

In the aforesaid method for operating the resistance type memory, the method of adjusting the resistivity of the tungsten oxide layer 110 of the resistance type memory device 102 includes manipulating a pulse-applied number of the pulse voltage and a pulse-applied time thereof. Detailed descriptions are provided as follows.

First of all, the method for operating the resistance type memory through manipulating the pulse-applied number of the pulse voltage is introduced.

When no pulse voltage is applied to the tungsten oxide layer 110, the resistance type memory device 102 is in the first storage state (0,1).

When the pulse-applied number is less than a first critical number Nc1, the resistance type memory device 102 is programmed to be in the second storage state (0,0).

When the pulse-applied number ranges from the first critical number $N_{c1}$ to a second critical number $N_{c2}$, the resistance type memory device 102 is programmed to be in the third storage state (1,0).

When the pulse-applied number is more than the second critical number $N_{c2}$, the resistance type memory device 102 is programmed to be in the fourth storage state (1,1).

Here, the second critical number $N_{c2}$ is greater than the first critical number $N_{c1}$. For example, when 1.5V of the pulse voltage is applied to the tungsten oxide layer 110 for 60-80 nsec, the first critical number $N_{c1}$ and the second critical number $N_{c2}$ are approximately 60 and 120, respectively.

The pulse-applied number of the pulse voltage is, for example, simultaneously or independently manipulated when an operation is performed on the resistance type memory device 102 of the resistance type memory.

Figure 3:
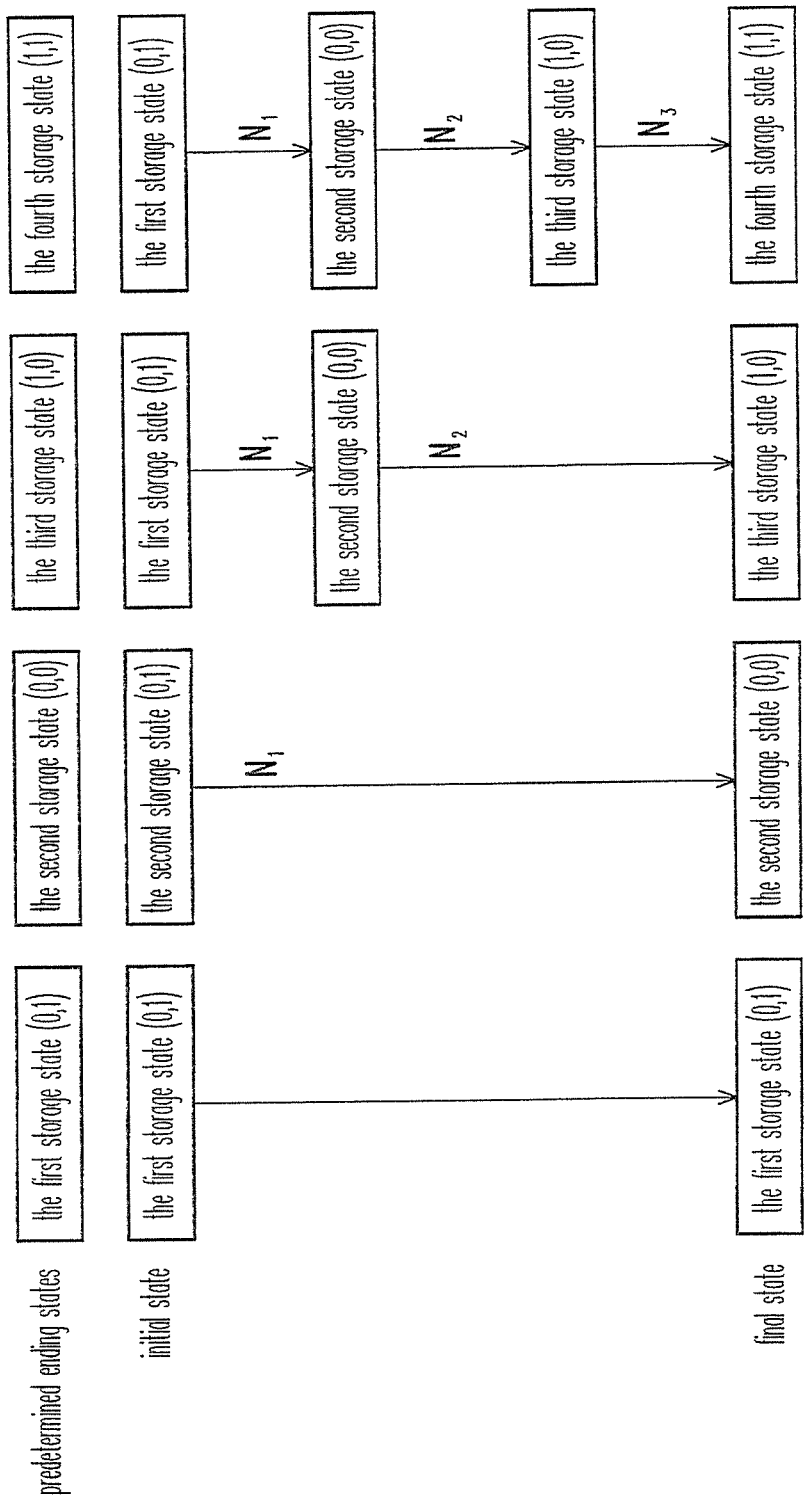
FIG. 3 is a schematic view illustrating a method for operating the resistance type memory according to a first embodiment of the present invention.

FIG. 3 is a schematic view illustrating a method for operating the resistance type memory according to a first embodiment of the present invention.

Please refer to FIGS. 1 and 3 together. When an operation of simultaneously manipulating the pulse-applied number is performed on the resistance type memory, the resistance type memory devices 102 are with predetermined ending states in the first storage state (0,1), the second storage state (0,0), the third storage state (1,0), and the fourth storage state (1,1).

When no pulse voltage is applied, each of the resistance type memory devices 102 is initially in the first storage state (0,1). Since no pulse voltage is applied to the resistance type memory device 102 with predetermined ending states in the first storage state (0,1), the final state of said resistance type memory device 102 remains in the first storage state (0,1).

Next, a first pulse-applied number $N_1$ of the pulse voltage is applied to each of the memory devices 102 other than to the resistance type memory devices 102 with predetermined ending states in the first storage state (0,1). Here, the first pulse-applied number $N_1$ is less than the first critical number $Nc_1$. And, aside from the resistance type memory devices 102 with predetermined ending states in the first storage state (0,1), each of the memory devices is programmed from the first storage state (0,1) to the second storage state (0,0) as a final state.

Then, a second pulse-applied number $N_2$ of the pulse voltage is applied to each of the memory devices 102 other than to the resistance type memory devices 102 with predetermined ending states in the first storage state (0,1) and the second storage state (0,0). The total of the first pulse-applied number $N_1$ and of the second pulse-applied number $N_2$ ranges from the first critical number $N_{c1}$ to the second critical number $N_{c2}$. And, aside from the resistance type memory devices 102 with predetermined ending states in the first storage state (0,1) and the second storage state (0,0), each of the memory devices is programmed from the second storage state (0,0) to the third storage state (1,0) as the final state.

Thereafter, a third pulse-applied number $N_3$ of the pulse voltage is applied to each of the memory devices 102 other than to the resistance type memory devices 102 with predetermined ending states in the first storage state (0,1), the second storage state (0,0), and the third storage state (1,0). The total of the first pulse-applied number $N_1$, the second pulse-applied number $N_2$, and the third pulse-applied number $N_3$ is more than the second critical number $Nc_2$. And, aside from the resistance type memory devices 102 with predetermined ending states in the first storage state (0,1), the second storage state (0,0), and the third storage state (1,0), each of the memory devices 102 is programmed from the third storage state (1,0) to the fourth storage state (1,1) as the final state.

Figure 4:
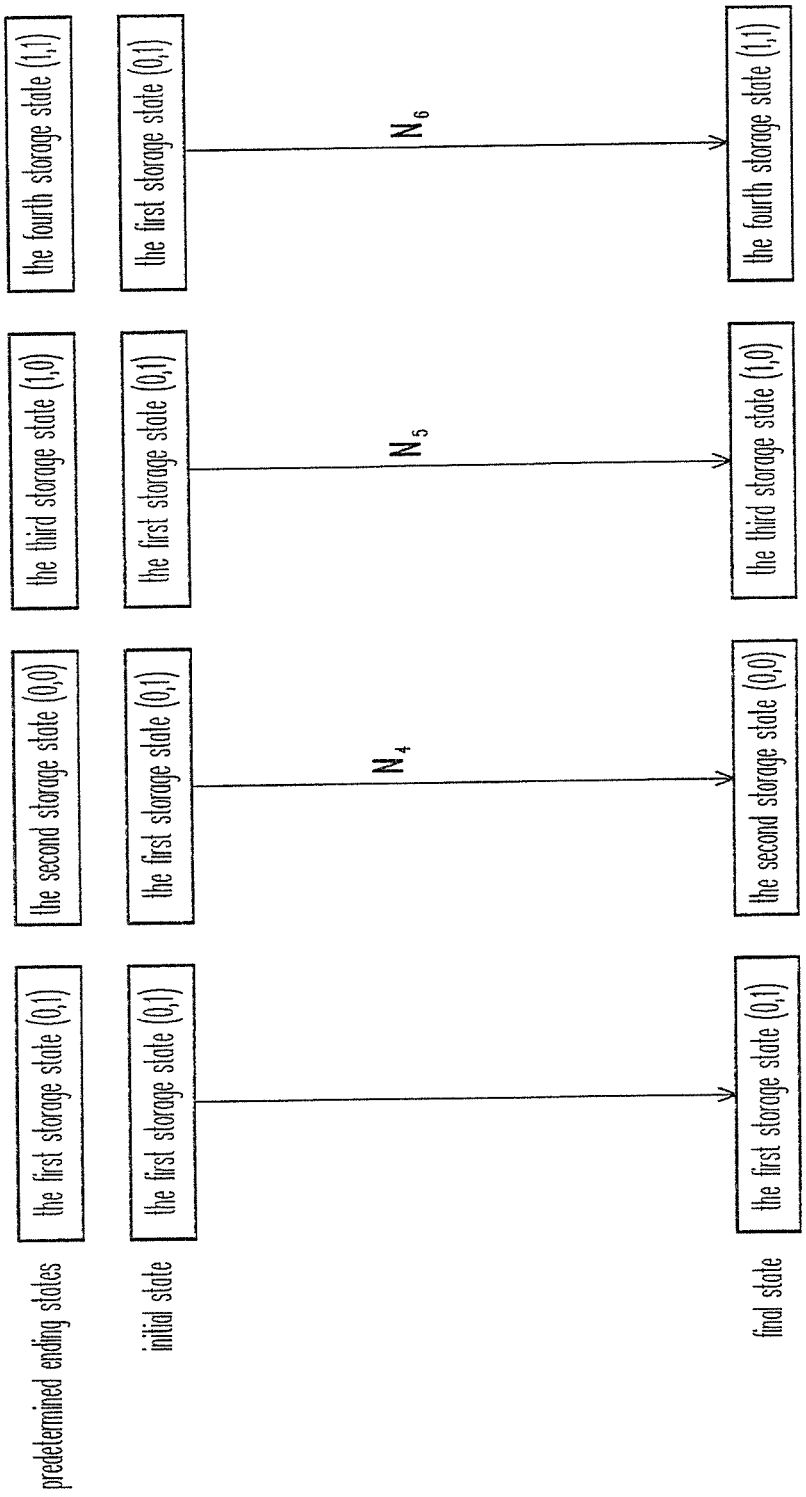
FIG. 4 is a schematic view illustrating a method for operating the resistance type memory according to a second embodiment of the present invention.

FIG. 4 is a schematic view illustrating a method for operating the resistance type memory according to a second embodiment of the present invention.

Please refer to FIGS. 1 and 4 together. When a process of independently manipulating the pulse-applied number is performed on the resistance type memory, the resistance type memory devices 102 are with predetermined ending states in the first storage state (0,1), the second storage state (0,0), the third storage state (1,0), and the fourth storage state (1,1). When no pulse voltage is applied, each of the resistance type memory devices 102 is initially in the first storage state (0,1). Since no pulse voltage is applied to the resistance type memory device 102 with predetermined ending states in the first storage state (0,1), the final state of said resistance type memory device 102 remains in the first storage state (0,1).

Then, a fourth pulse-applied number $N_4$ of the pulse voltage is applied to each of the resistance type memory devices 102 which is with predetermined ending states in the second storage state (0,0). Here, the fourth pulse-applied number $N_4$ is less than the first critical number $N_{c1}$, and thereby each of the resistance type memory devices 102 with predetermined ending states in the second storage state (0,0) remains in the second storage state (0,0) as the final state.

Next, a fifth pulse-applied number $N_5$ of the pulse voltage is applied to each of the resistance type memory devices 102 which is with predetermined ending states in the third storage state (1,0). Here, the fifth pulse-applied number $N_5$ ranges from the first critical number $N_{c1}$ to the second critical number $N_{c2}$. Thereby, each of the resistance type memory devices 102 with predetermined ending states in the third storage state (1,0) remains in the third storage state (1,0) as the final state.

Thereafter, a sixth pulse-applied number $N_6$ of the pulse voltage is applied to each of the resistance type memory devices 102 which is with predetermined ending states in the fourth storage state (1,1). Here, the sixth pulse-applied number $N_6$ is more than the second critical number $N_{c2}$. Thereby, each of the resistance type memory devices 102 with predetermined ending states in the fourth storage state (1,1) remains in the fourth storage state (1,1) as the final state.

The method for operating the resistance type memory through manipulating the pulse-applied time of the pulse voltage is introduced hereinafter.

Figure 5:
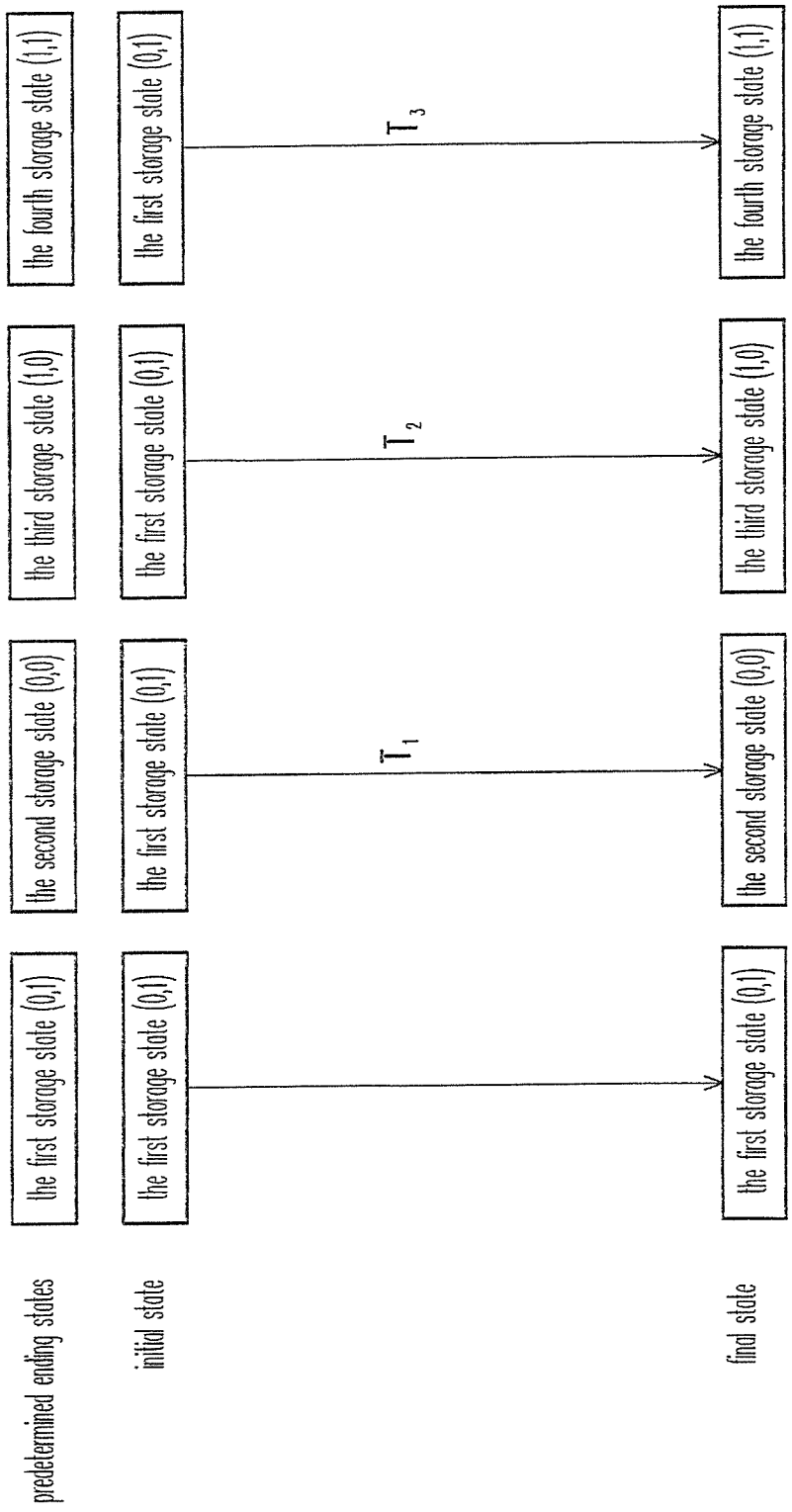
FIG. 5 is a schematic view illustrating a method for operating the resistance type memory according to a third embodiment of the present invention.

FIG. 5 is a schematic view illustrating a method for operating the resistance type memory according to a third embodiment of the present invention.

Please refer to FIGS. 1 and 5 together. First, the resistance type memory devices 102 are with predetermined ending states in the first storage state (0,1), the second storage state (0,0), the third storage state (1,0), and the fourth storage state (1,1). When no pulse voltage is applied, each of the resistance type memory devices 102 is initially in the first storage state (0,1). Since no pulse voltage is applied to the resistance type memory device 102 with predetermined ending states in the first storage state (0,1), the final state of said resistance type memory device 102 remains in the first storage state (0,1).

Then, a first pulse-applied time $T_1$ is applied to each of the resistance type memory devices 102 which is with predetermined ending states in the second storage state (0,0). Thereby, each of the resistance type memory devices 102 with predetermined ending states in the second storage state (0,0) remains in the second storage state (0,0) as the final state.

Next, a second pulse-applied time $T_2$ is applied to each of the resistance type memory devices 102 which is with predetermined ending states in the third storage state (1,0). Thereby, each of the resistance type memory devices 102 with predetermined ending states in the third storage state (1,0) remains in the third storage state (1,0) as the final state.

Thereafter, a third pulse-applied time $T_3$ is applied to each of the resistance type memory devices 102 which is with predetermined ending states in the fourth storage state (1,1). Thereby, each of the resistance type memory devices 102 with predetermined ending states in the fourth storage state (1,1) remains in the fourth storage state (1,1) as the final state.

Here, the first pulse-applied time $T_1$ is less than the second pulse-applied time $T_2$, and the second pulse-applied time $T_2$ is less than the third pulse-applied time $T_3$. For example, when 1.5V of the pulse voltage is applied to each of the resistance type memory devices 102, the first pulse-applied time $T_1$ is approximately 60~80 nsec, the second pulse-applied time $T_2$ is approximately 200~500 nsec, and the third pulse-applied time $T_3$ is approximately 800~1000 nsec.

In view of the aforesaid embodiments, it is known that the method for operating the resistance type memory is to apply voltages to the tungsten oxide layers of the resistance type memory devices so as to adjust the resistivities thereof. Due to different resistivities of the tungsten oxide layers, the resistance type memory devices correspondingly have four different data storage states. Thereby, the requirement of multiple-bit storage at a storage point can be satisfied.

Figure 6:
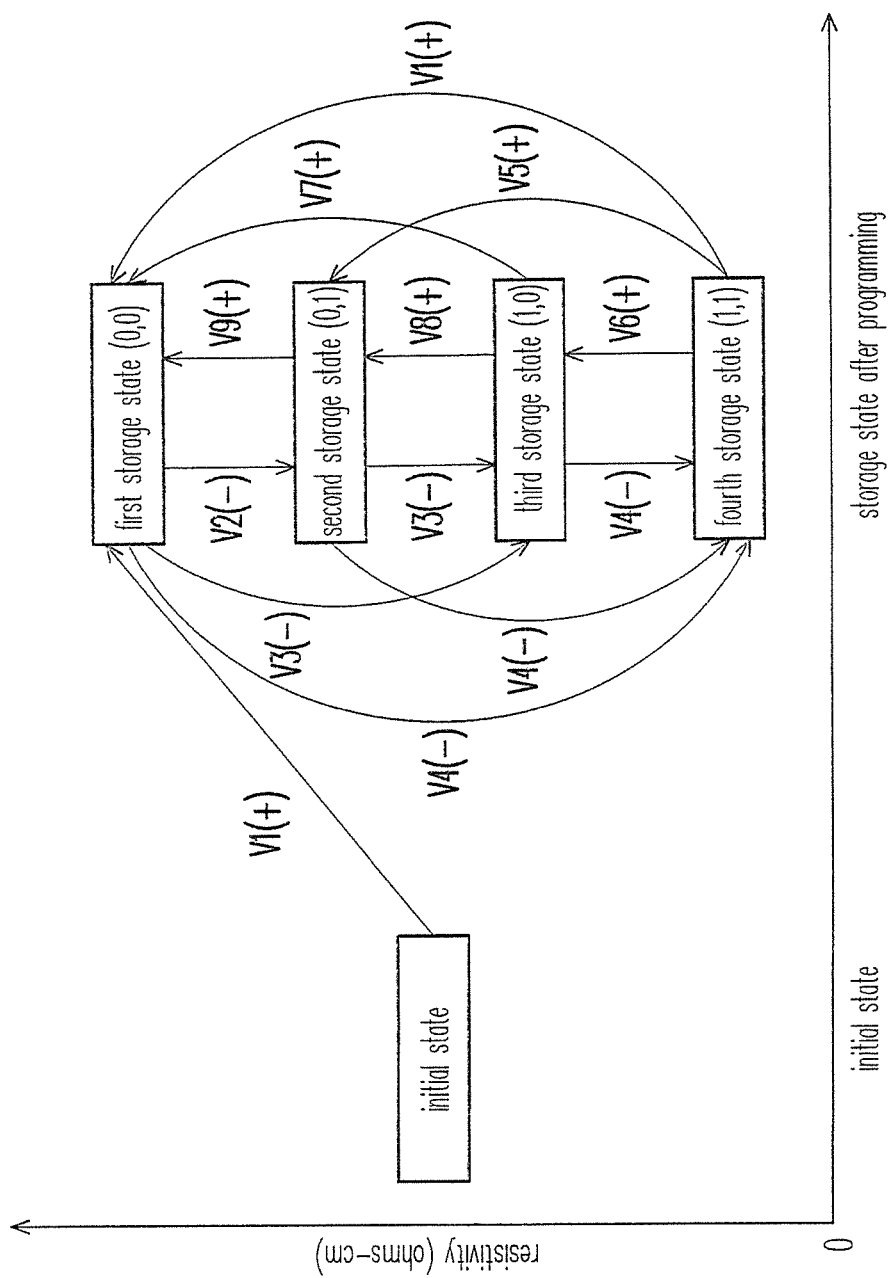
FIG. 6 is a schematic view illustrating a method for operating a resistance type memory device 102 according to a fourth embodiment of the present invention.

FIG. 6 is a schematic view illustrating a method for operating a resistance type memory device according to a fourth embodiment of the present invention.

First, referring to FIGS. 1 and 6 together, a first positive pulse voltage V1(+) is applied to a resistance type memory device 102 in an initial state, so as to program the same to be in a first storage state (0,0).

Then, as the resistance type memory device 102 is in the first storage state (0,0), a second negative pulse voltage V2(−) is applied to the resistance type memory device 102, so as to program the same to be in a second storage state (0,1).

Next, as the resistance type memory device 102 is in the second storage state (0,1), a third negative pulse voltage V3(−) is applied to the resistance type memory device 102, so as to program the same to be in a third storage state (1,0).

Thereafter, as the resistance type memory device 102 is in the third storage state (1,0), a fourth negative pulse voltage V4(−) is applied to the resistance type memory device 102, so as to program the same to be in a fourth storage state (1,1).

Afterwards, as the resistance type memory device 102 is in the fourth storage state (1,1), the first positive pulse voltage V1(+) is applied to the resistance type memory device 102, so as to program the same to be in the first storage state (0,0). Accordingly, a plurality of programming operations can be performed repeatedly on the resistance type memory device 102.

Here, the value correlations of various voltages applied to the resistance type memory device 102 in various states are as follows: an absolute value of the second negative pulse voltage V2(−) is less than that of the third negative pulse voltage V3(−), and the absolute value of the third negative pulse voltage V3(−) is less than that of the fourth negative pulse voltage V4(−). According to one embodiment, the first positive pulse voltage V1(+) is 15V, for example. The second negative pulse voltage V2(−) is −3.3V, for example. The third negative pulse voltage V3(−) is −6V, for example. The fourth negative pulse voltage V4(−) is −13V, for example.

Moreover, the resistivity of the resistance type memory device 102 in the initial state is a fifth resistivity, the resistivity of the resistance type memory device 102 in the first storage state (0,0) is a sixth resistivity, the resistivity of the resistance type memory device 102 in the second storage state (0,1) is a seventh resistivity, the resistivity of the resistance type memory device 102 in the third storage state (1,0) is an eighth resistivity, and the resistivity of the resistance type memory device 102 in the fourth storage state (1,1) is a ninth resistivity. Here, the sixth resistivity is greater than the seventh resistivity, the seventh resistivity is greater than the eighth resistivity, the eighth resistivity is greater than the ninth resistivity, and the fifth resistivity is between the seventh and the eighth resistivities. The sixth resistivity is greater than 0.25 ohms-cm, for example. The seventh resistivity ranges from 0.15 ohms-cm to 0.25 ohms-cm, for example. The eighth resistivity ranges from 0.09 ohms-cm to 0.15 ohms-cm, for example. The ninth resistivity is less than 0.09 ohms-cm, for example.

It should be noted that the resistance type memory device 102 in the first storage state (0,0) can be directly programmed to be in the third storage state (1,0) or in the fourth storage state (1,1). As the resistance type memory device 102 is in the first storage state (0,0), the third negative pulse voltage V3(−) is applied to the resistance type memory device 102, and thereby the resistance type memory device 102 can be directly programmed to be in the third storage state (1,0). As the resistance type memory device 102 is in the first storage state (0,0), the fourth negative pulse voltage V4(−) is applied to the resistance type memory device 102, and thereby the resistance type memory device 102 can be directly programmed to be in the fourth storage state (1,1).

Likewise, the fourth negative pulse voltage V4(−) is applied to the resistance type memory device 102 in the second storage (0,1), and thereby the resistance type memory device 102 can be directly programmed to be in the fourth storage state (1,1).

Furthermore, the resistance type memory device 102 in the fourth storage state (1,1) can be directly programmed to be in the second storage state (0,1) or in the third storage state (1,0). As the resistance type memory device 102 is in the fourth storage state (1,1), a fifth positive pulse voltage V5(+) is applied to the resistance type memory device 102, and thereby the resistance type memory device 102 can be directly programmed to be in the second storage state (0,1). As the resistance type memory device 102 is in the fourth storage state (1,1), a sixth positive pulse voltage V6(+) is applied to the resistance type memory device 102, and thereby the resistance type memory device 102 can be directly programmed to be in the third storage state (1,0). Here, the first positive pulse voltage V1(+) exceeds the fifth positive pulse voltage V5(+), and the fifth positive pulse voltage V5(+) exceeds the sixth positive pulse voltage V6(+).

Similarly, the resistance type memory device 102 in the third storage state (1,0) can be directly programmed to be in the first storage state (0,0) or in the second storage state (0,1). As the resistance type memory device 102 is in the third storage state (1,0), a seventh positive pulse voltage V7(+) is applied to the resistance type memory device 102, and thereby the resistance type memory device 102 can be directly programmed to be in the first storage state (0,0). As the resistance type memory device 102 is in the third storage state (1,0), an eighth positive pulse voltage V8(+) is applied to the resistance type memory device 102, and thereby the resistance type memory device 102 can be directly programmed to be in the second storage state (0,1). Here, the seventh positive pulse voltage V7(+) exceeds the eighth positive pulse voltage V8(+).

Likewise, a ninth positive pulse voltage V9(+) is applied to the resistance type memory device 102 in the second storage (0,1), and thereby the resistance type memory device 102 can be directly programmed to be in the first storage state (0,0).

Figure 7:
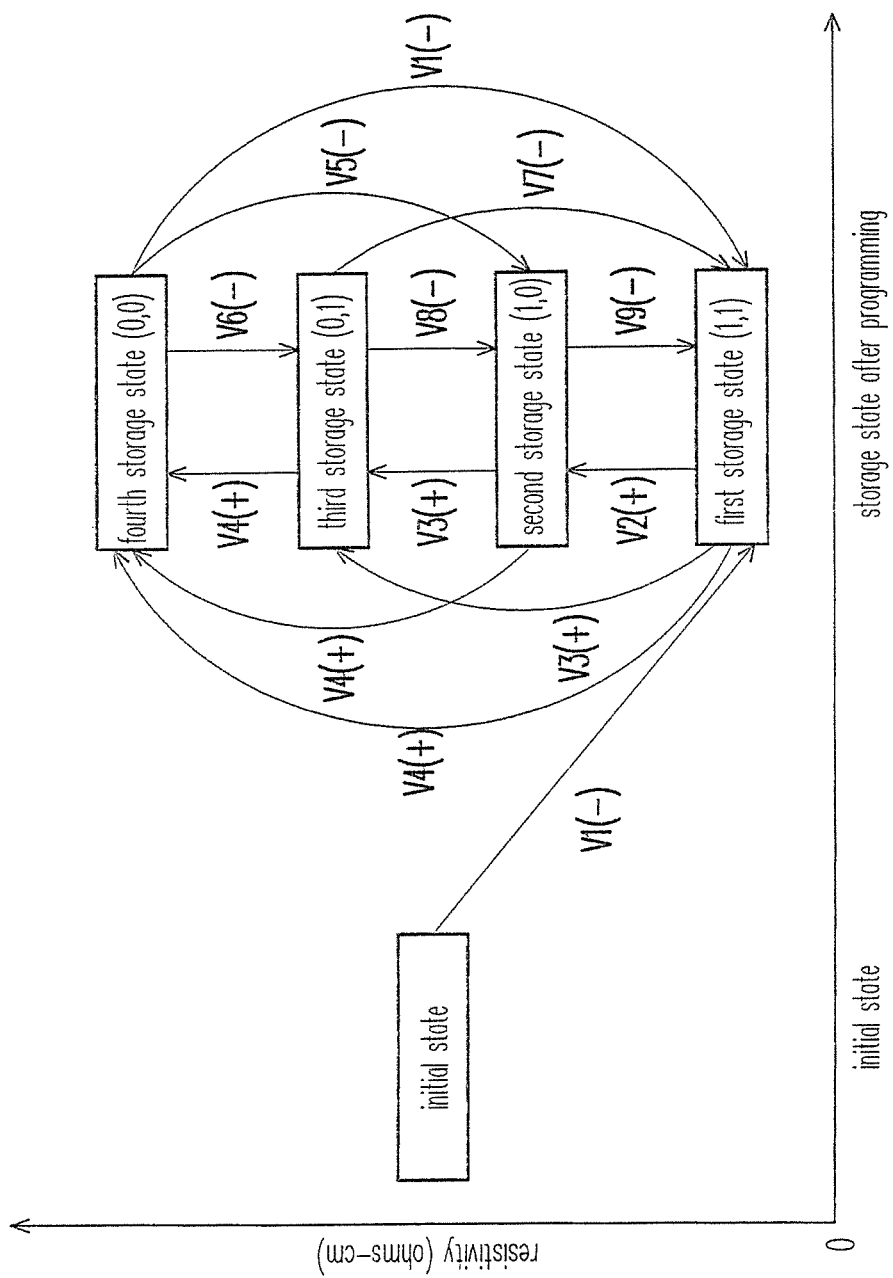
FIG. 7 is a schematic view illustrating a method for operating the resistance type memory device 102 according to a fifth embodiment of the present invention.

FIG. 7 is a schematic view illustrating a method for operating a resistance type memory device 102 according to a fifth embodiment of the present invention.

First, referring to FIGS. 1 and 7 together, a first negative pulse voltage V1(−) is applied to the resistance type memory device 102 in an initial state, so as to program the same to be in a first storage state (1,1).

Then, as the resistance type memory device 102 is in the first storage state (1,1), a second positive pulse voltage V2(+) is applied to the resistance type memory device 102, so as to program the same to be in a second storage state (1,0).

Next, as the resistance type memory device 102 is in the second storage state (1,0), a third positive pulse voltage V3(+) is applied to the resistance type memory device 102, so as to program the same to be in a third storage state (0,1).

Thereafter, as the resistance type memory device 102 is in the third storage state (0,1), a fourth positive pulse voltage V4(+) is applied to the resistance type memory device 102, so as to program the same to be in a fourth storage state (0,0).

Afterwards, as the resistance type memory device 102 is in the fourth storage state (0,0), the first negative pulse voltage V1(−) is applied to the resistance type memory device 102, so as to program the same to be in the first storage state (1,1). Accordingly, a plurality of programming operations can be performed repeatedly on the resistance type memory device 102.

Here, the value correlations of various voltages applied to the resistance type memory device 102 in various states are as follows: the second positive pulse voltage V2(+) is less than the third positive pulse voltage V3(+), and the third positive pulse voltage V3(+) is less than the fourth positive pulse voltage V4(+).

Moreover, the resistivity of the resistance type memory device 102 in the initial state is a tenth resistivity, the resistivity of the resistance type memory device 102 in the first storage state (1,1) is an eleventh resistivity, the resistivity of the resistance type memory device 102 in the second storage state (1,0) is a twelfth resistivity, the resistivity of the resistance type memory device 102 in the third storage state (0,1) is a thirteen resistivity, and the resistivity of the resistance type memory device 102 in the fourth storage state (0,0) is a fourteenth resistivity. Here, the eleventh resistivity is less than the twelfth resistivity, the twelfth resistivity is less than the thirteenth resistivity, the thirteenth resistivity is less than the fourteenth resistivity, and the tenth resistivity is between the twelfth and the thirteenth resistivities. The eleventh resistivity is less than 0.09 ohms-cm, for example. The twelfth resistivity ranges from 0.09 ohms-cm to 0.15 ohms-cm, for example. The thirteenth resistivity ranges from 0.15 ohms-cm to 0.25 ohms-cm, for example. The fourteenth resistivity is greater than 0.25 ohms-cm, for example.

It should be noted that the resistance type memory device 102 in the first storage state (1,1) can be directly programmed to be in the third storage state (0,1) or in the fourth storage state (0,0). As the resistance type memory device 102 is in the first storage state (1,1), the third positive pulse voltage V3(+) is applied to the resistance type memory device 102, and thereby the resistance type memory device 102 can be directly programmed to be in the third storage state (0,1). As the resistance type memory device 102 is in the first storage state (1,1), the fourth positive pulse voltage V4(+) is applied to the resistance type memory device 102, and thereby the resistance type memory device 102 can be directly programmed to be in the fourth storage state (0,0).

Likewise, the fourth positive pulse voltage V4(+) is applied to the resistance type memory device 102 in the second storage (1,0), and thereby the resistance type memory device 102 can be directly programmed to be in the fourth storage state (0,0).

Furthermore, the resistance type memory device 102 in the fourth storage state (0,0) can be directly programmed to be in the second storage state (1,0) or in the third storage state (0,1). As the resistance type memory device 102 is in the fourth storage state (0,0), a fifth negative pulse voltage V5(−) is applied to the resistance type memory device 102, and thereby the resistance type memory device 102 can be directly programmed to be in the second storage state (1,0). As the resistance type memory device 102 is in the fourth storage state (0,0), a sixth negative pulse voltage V6(−) is applied to the resistance type memory device 102, and thereby the resistance type memory device 102 can be directly programmed to be in the third storage state (0,1). Here, an absolute value of the first negative pulse voltage V1(−) is greater than that of the fifth negative pulse voltage V5(−), and the absolute value of the fifth negative pulse voltage V5(−) is greater than that of the sixth negative pulse voltage V6(−).

Similarly, the resistance type memory device 102 in the third storage state (0,1) can be directly programmed to be in the first storage state (1,1) or in the second storage state (1,0). As the resistance type memory device 102 is in the third storage state (0,1), a seventh negative pulse voltage V7(−) is applied to the resistance type memory device 102, and thereby the resistance type memory device 102 can be directly programmed to be in the first storage state (1,1). As the resistance type memory device 102 is in the third storage state (0,1), an eighth negative pulse voltage V8(−) is applied to the resistance type memory device 102, and thereby the resistance type memory device 102 can be directly programmed to be in the second storage state (1,0). Here, the absolute value of the seventh negative pulse voltage V7(−) is greater than that of the eighth negative pulse voltage V8(−).

Likewise, a ninth negative pulse voltage V9(−) is applied to the resistance type memory device 102 in the second storage (1,0), and thereby the resistance type memory device 102 can be directly programmed to be in the first storage state (1,1).

In view of the foregoing, in the method for operating the resistance type memory device 102, a plurality of the programming operations can be performed repeatedly on the resistance type memory device through applying the different pulse voltages. Besides, according to said method, the programming speed can be significantly increased. The fastest speed is equal to or less than 9 nsec.

In summary, the present invention has at least the following advantages:
1. The resistance type memory device of the present invention is capable of performing the multiple-bit storage operation at a storage point.
2. The resistance type memory device of the present invention can be applied to the volatile and the non-volatile memories.
3. The resistance type memory device of the present invention has high thermal stability, so that the data storage function of the resistance type memory device is not deteriorated in a high temperature environment.
4. The method for fabricating the resistance type memory device provided by the present invention adopts a self-aligned manufacturing technology. Thus, no additional masks are required, and the method for fabricating said resistance type memory devices can be easily integrated into the current manufacturing process.
5. The method for operating the resistance type memory provided by the present invention satisfies the requirement of the multiple-bit storage at a storage point.
6. The method for operating the resistance type memory device provided by the present invention enables a plurality of the programming operations to be performed repeatedly.
7. Through the method for operating the resistance type memory device provided by the present invention, the programming speed can be significantly increased.

Although the present invention has been disclosed above by the preferred embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A resistance type memory device with a first resistivity, a second resistivity, and a third resistivity, comprising:
   a first and a second conductors, and
   a means for enabling the resistance type memory device to have the second resistivity in an operating mode with a first pulse voltage, and for enabling the resistance type memory device to have the third resistivity in an operating mode with a second pulse voltage, wherein the means is disposed between the first and the second conductors, and the means is monometallic oxide, the second resistivity is greater than the first resistivity, and the first resistivity is greater than the third resistivity, wherein the means further enables the resistance type memory device to have a fourth resistivity in an operating mode with a third pulse voltage, and the third resistivity is greater than the fourth resistivity.

2. The resistance type memory device of claim 1, wherein the means comprises tungsten oxide.

3. A resistance type memory device with a first storage state, a second storage state, and a third storage state, comprising:
   a bottom electrode and a top electrode;
   a means for enabling the resistance type memory device to have the first storage state in an operating mode with a first pulse voltage, for enabling the resistance type memory device to have the second storage state in an operating mode with the first pulse voltage and a second pulse voltage, and for enabling the resistance type memory device to have the third storage state in an operating mode with the first pulse voltage, the second pulse voltage, and a third pulse voltage, wherein the means is disposed between the bottom and the top conductors, and the means is monometallic oxide, and a polarity of the first pulse voltage is different from a polarity of the second and the third pulse voltages.

4. The resistance type memory device of claim 3, wherein the means comprises tungsten oxide.

5. The resistance type memory device of claim 3, wherein the means further enables the resistance type memory device to have a fourth resistivity in an operating mode with the first, the second, the third and a fourth pulse voltages, and a polarity of the first pulse voltage is different from a polarity of the fourth pulse voltage.

6. A resistance type memory device with a first storage state, a second storage state, and a third storage state, comprising:
   a first and a second electrodes; and
   a means for enabling the resistance type memory device to have the first storage state in an operating mode with a first pulse voltage, for enabling the resistance type memory device to have the second storage state in an operating mode with the first pulse voltage and a second pulse voltage, and for enabling the resistance type memory device to have the third storage state in an operating mode with the first pulse voltage and a third pulse voltage, wherein the means is coupled with the first and the second electrodes, the means is monometallic oxide, and the third pulse voltage is greater than the second pulse voltage,
   wherein the means further enables the resistance type memory device to have the fourth storage state in an operating mode with the first and a fourth pulse voltages, and the fourth pulse voltage is greater than the third pulse voltage.

7. The resistance type memory device of claim 6, wherein the means comprises tungsten oxide.

8. A resistance type memory device with a first resistivity, a second resistivity, and a third resistivity, comprising:
   a first and a second conductors, and
   a means for enabling the resistance type memory device to have the second resistivity in an operating mode with a first pulse voltage, and for enabling the resistance type memory device to have the third resistivity in an operating mode with a second pulse voltage, wherein the means is disposed between the first and the second conductors, and the means is monometallic oxide, the second resistivity is greater than the first resistivity, and the first resistivity is greater than the third resistivity, wherein the means and one of the first conductor and the second conductor have the same metal element, the means further enables the resistance type memory device to have a fourth resistivity in an operating mode with a third pulse voltage, and the third resistivity is greater than the fourth resistivity.

9. The resistance type memory device of claim 8, wherein the means comprises tungsten oxide.

\* \* \* \* \*